United States Patent [19]

Copeland et al.

[11] Patent Number: 5,717,575

[45] Date of Patent: Feb. 10, 1998

[54] BOARD MOUNTING SYSTEM WITH SELF GUIDING INTERENGAGEMENT

[75] Inventors: Jeffrey P. Copeland, Jefferson; Dennis Robinson, Marlboro, both of Mass.

[73] Assignee: Digital Equipment Corporation, Maynard, Mass.

[21] Appl. No.: 512,854

[22] Filed: Aug. 9, 1995

[51] Int. Cl.$^6$ ...................... H05K 7/12
[52] U.S. Cl. .............. 361/756; 361/756; 361/725; 361/741; 361/802; 439/61; 439/62; 439/59; 248/680; 248/222.11
[58] Field of Search .................. 361/756, 741, 361/609, 683, 802, 785, 788, 725; 439/61, 62, 59, 928.1; 248/222.11, 680

[56] References Cited

U.S. PATENT DOCUMENTS

| | | | |
|---|---|---|---|
| 3,885,767 | 5/1975 | Olowinski et al. | 248/204 |
| 4,911,310 | 3/1990 | Raishe et al. | 211/87 |
| 4,985,870 | 1/1991 | Faraci | 365/228 |
| 5,563,766 | 10/1996 | Long et al. | 361/600 |

*Primary Examiner*—Leo P. Picard
*Assistant Examiner*—David Foster
*Attorney, Agent, or Firm*—Dirk Brinkman; A. Sidney Johnston; Michael Rodriguez

[57] ABSTRACT

This invention is a system for self guiding interengagement of a securement member within a mating member having a slot for holding and securing two surface areas. The securement member is attached to one surface area and the mating member is attached to the other surface area. The securement member has a shape and the mating member has a tongue with a guiding surface, thereby promoting self guiding interengagement of the securement member within the slot of the mating member. The system is convenient for inserting a board within the obstructed view of a receptacle, such as a computer enclosure.

12 Claims, 6 Drawing Sheets

BOARD MOUNTING SYSTEM WITH SELF GUIDING INTERENGAGEMENT

BACKGROUND OF THE INVENTION

This invention relates in a broad sense to a system for self guiding interengagement of a securement member and a mating member for holding and securing two surface areas. In a narrower sense, this invention is especially useful if the user's view is obstructed when guidingly inserting and securing a board within a receptacle. For example, this invention is useful for inserting a circuit board within a computer enclosure.

Electronic systems, such as computer and telecommunication systems, include components set within receptacles. These receptacles usually include boards that are either hard mounted or are held in place by brackets. Current systems for inserting and securing a board within a receptacle usually require multiple parts that include screws and snaps. Moreover, these systems require guide pins to guide and position the board for insertion within a receptacle and only provide support for boards in either a horizontal or vertical position, not both.

Prior bracket systems have tried many different methods of guidingly inserting and holding boards, such as circuit boards, into a fixed position within a receptacle. For example, one typical method is to hold boards in a fixed position by clamping the board's edges to the receptacle. As a consequence, the board is fixed within the receptacle; however, the clamps do not provide guidance for inserting the board, and after board insertion do not prevent vibrations or movement of the receptacle during operation or at other times from producing high cyclic stress upon the board. As a consequence, the frequency of the board movements, particularly at the center of the board caused by low frequency vibration and high board displacement can result in damage to the board or a shortening of the board's effective life.

Although systems have tried many different methods of inserting and holding a board within a receptacle, a solution to overcome vibration movement remains unmet. As a consequence, there is a need for an improved system that is capable of guidingly inserting and securing a variety of board sizes and types of boards within a receptacle, and reducing the cyclic stress caused by vibrations that are placed upon boards held in a receptacle.

SUMMARY OF THE INVENTION

An object of the invention is an improved system for guidingly engaging and securing two surfaces areas.

Another object of the invention is an improved system for guidingly engaging and securing a board and a receptacle.

Yet another object of the invention is an improved system for guidingly engaging and securing a CPU board within a computer enclosure.

Still another object of the invention is an improved system for reducing the cyclic stress placed upon a board held in a receptacle. For the best reduction in cyclic stress, the securement member should be attached to the board area that responds to external forces with the lowest frequency and highest displacement. Structural dynamic research tests are used to measure each board area's response to external forces. In response to an external force placed upon the board, accelerometer measurements of each board areas vibrational frequency and displacement are processed and graphically depicted by using structural dynamic research software. The test results and graphical representations identify the board area of lowest frequency and highest displacement.

These and other objects are, in a broad sense, obtained by a system for securing two surfaces in spaced relation. The system comprises two surface areas, a mating member of rigid material having a slot, and a securement member of rigid material having a surface portion with a shape for self guiding interengagement with the slot. The mating member is attached to one surface area, and the securement member is attached to the other one of the surface areas. The surface areas are movable relative to each other such that the surface portion of the securement member serf guidingly interengage the slot of the mating member.

In a narrower sense, this system obtains these and other objects by guidingly interengaging and securing a board within a receptacle. A securement member having a flange attached to the major surface portion of the board is mounted in spaced relation from the major surface of the board. The receptacle includes two opposing spaced apart walls connected by a base and a mounting member having a slot attached to the base. Supports, such as guide members, are attached to the inwardly facing surface of each wall. Each guide member has a slot with a back wall surface spaced apart a distance greater than the width of the board. The flange of the securement member enters the slot of the guide members to guidingly mount the board in a mounted position within the receptacle. The base is in a spaced apart relationship with the board, wherein the slot receives the flange of the securement member to create a snug-fit aligned relationship between the board and the receptacle.

The system of the instant invention provides a number of advantages. For example, it is generic in its approach by allowing the system to be used in numerous applications of guidingly interengaging and securing two surface areas in spaced relation. Applicable uses in narrower embodiments of this invention include guidingly inserting and securing one or more boards in spaced apart relation within a receptacle. Further, because the system includes a minimal number of parts and does not include screws or snaps to mount the board, the system provides for guiding insertion and easy mounting and securement of the board within the receptacle. Then too, because the system is self-aligning and secures the board, no additional parts, such as pins, are needed for proper board mounting within a receptacle. Lastly, the board is easily mounted and firmly secured within the receptacle.

Other objects and advantages of the invention will become apparent as the invention is hereinafter described in more detail with reference made to the following drawings.

DETAILED DESCRIPTION OF THE PREFERRED EMBODIMENT

The invention is particularly applicable to securing a board and limiting board vibration, particularly at the center of a board mounted within a receptacle. The invention corrects a problem caused by the movement or vibration of a receptacle that may place cyclic stress upon the board and possible damage to the board or a shortening of the board's effective life. However, as will become apparent, the invention has greater utility and is applicable to numerous situations in which, a board is moved into place with respect to a base, such as the bottom surface of a receptacle.

Figure 1:
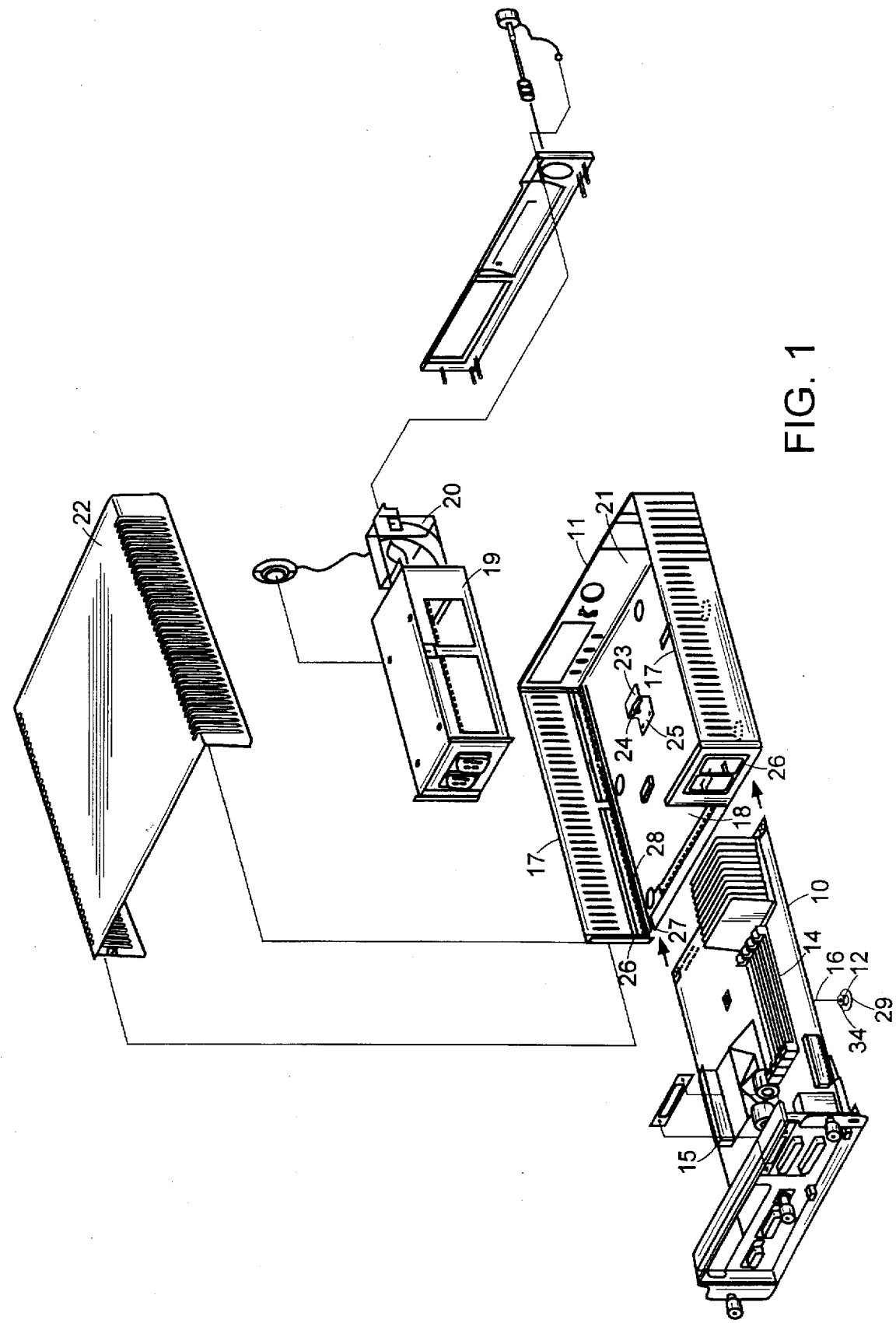
FIG. 1 is a perspective view of a partially exploded receptacle and interior components according to the principles of the invention. A mating member having a slot is shown mounted on the base of the receptacle. A CPU board is shown having a securement member mounted on the under surface of the board. Arrows indicate the direction of the board movement as the board moves into sliding engagement along the slot of the supports within the receptacle, wherein the slot receives a portion of the securement member in a snug-fit aligned relationship. Also shown within the partially exploded interior of the receptacle are electronic components (i.e., a power supply forming an interior wall of the receptacle, a fan, etc.)

As shown in FIG. 1, the board 10 is a CPU board and generally includes a securement member 12 having a flange 34 with an arcuate surface 29 conveniently drawn as a disk mounted on its major underside surface. The board 10, further includes electronic components (e.g., a processor chip 13, RAM chips 14, and cable assemblies 15, etc.) mounted on its major top surface. The arrangement of the electronic components allows for a securement portion area 16 to attach the securement member 12.

As shown, the receptacle 11 encases a computer and generally includes two spaced apart walls 17, a base 18, a power supply 19, a fan 20, a front wall 21 and a top 22. A mating member 23 having a slot 24 and a mounting surface 25 is mounted on the base 18. The arrangement of the components, the power supply 19 and fan 20, provides for an area to mount the mounting surface 25 of the mating member 23 to the base 18. Alternative embodiments of the receptacle 11 may include different components, such as disk drives, CD ROM players, component enclosures, etc., or a complete absence of components.

The receptacle further includes supports 26, that are shown as guide members, each guide member being attached to a wall 17 and having a slot 27 with a back wall surface 28 spaced apart a distance greater than the width of the board 10. Arrows indicate the direction for mounting the board 10 within the receptacle 11.

Figure 2:
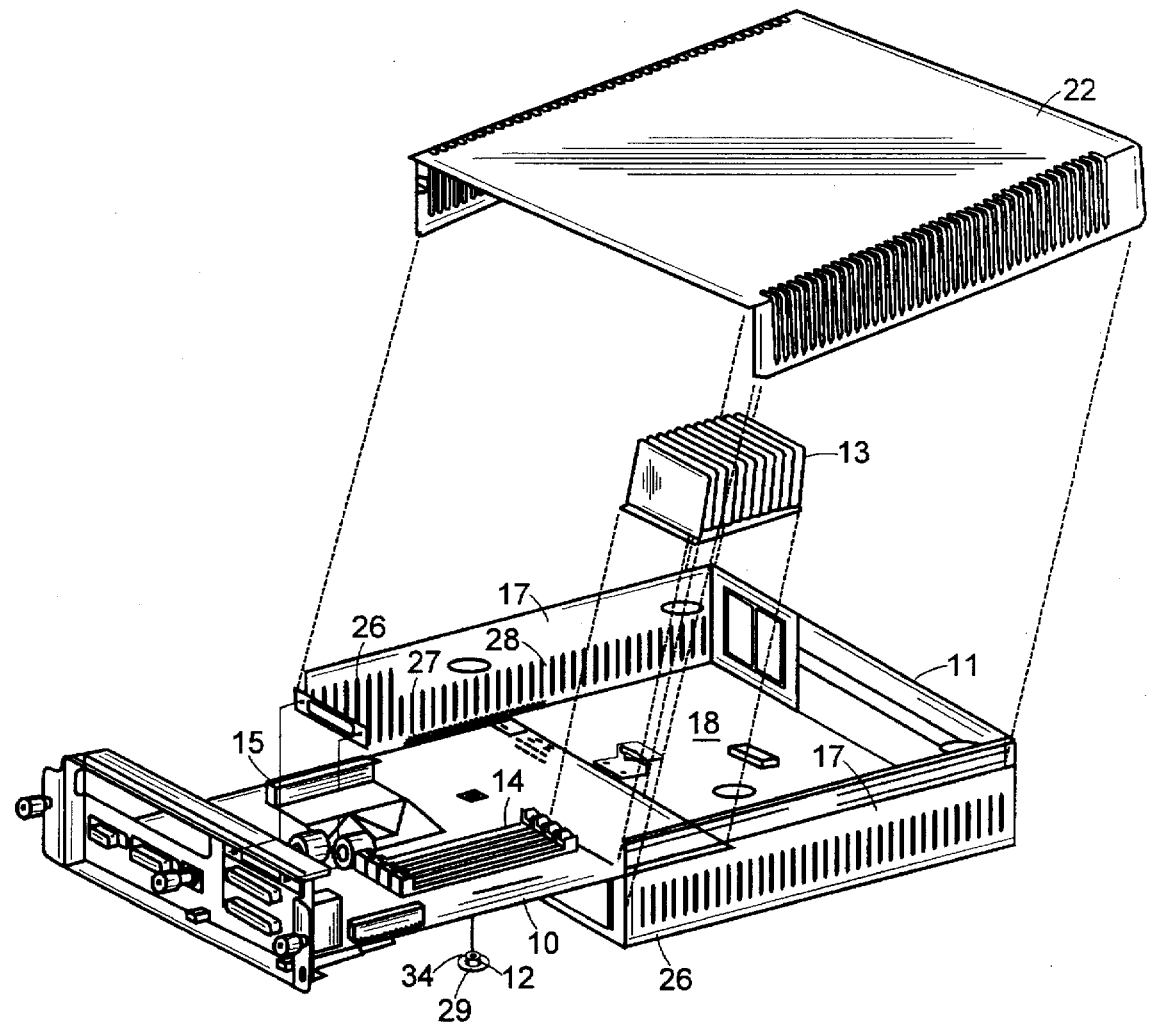
FIG. 2 is a perspective view of a partially exploded interior of a receptacle with a securement member mounted to the under surface of the board as shown in FIG. 1, wherein the board is moved into a partial mounting position along the guide members attached to the receptacle's spaced apart walls.

FIG. 2 shows the partially exploded interior of the receptacle 11, and the board 10 being moved into a partial mounting position along the guide members 26.

Alternative embodiments of this invention may include different types of boards, such as shelves, racks, drawers, trays, etc. The boards may have other components mounted to its top surface, such as compartments for holding objects of different sizes, ROM chips, etc., or may have a complete absence of components. Moreover, alternative embodiments of this invention may utilize other types of supports to mount and hold a board 10 within a receptacle 11. For example, instead of using guide members 26 attached to the inwardly facing walls 17, slots may be grooves in the inwardly facing walls 17.

Figure 3:
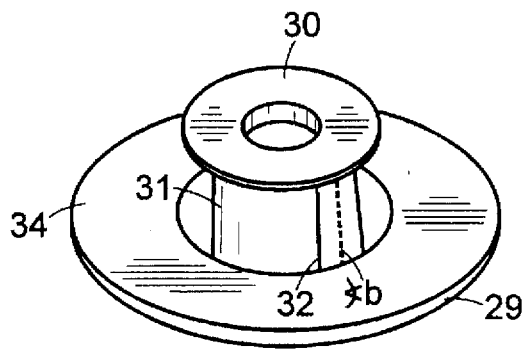
FIG. 3 is an elevated view of the securement member having a flange with an arcuate surface conveniently drawn as a disk as shown in FIGS. 1 and 2.
Figure 4:
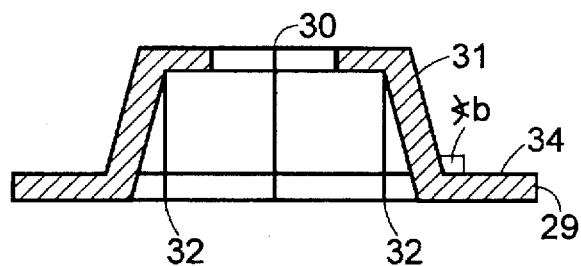
FIG. 4 is a plane view of the securement member having a flange with an arcuate surface conveniently drawn as a disk as shown in FIGS. 1, 2 and 3.
Figure 5:
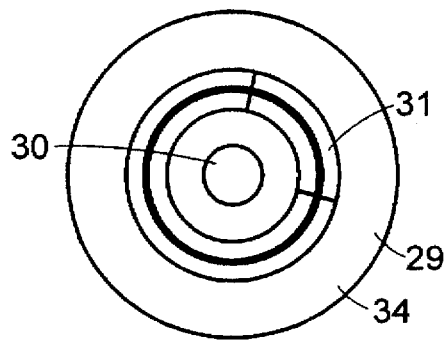
FIG. 5 is a top view of the securement member having a flange with an arcuate surface conveniently drawn as a disk as shown in FIGS. 1, 2, 3 and 4.

FIGS. 3, 4 and 5 more clearly show the securement member 12 made of rigid material having a flange 34 with an arcuate surface 29 conveniently drawn as a disk, a mounting surface 30 and a posting surface 31. The flange's 34 arcuate surface 29 promotes self aligning movement and ease of insertion of the securement member as the flange 34 enters the slot 24, as shown in FIGS. 1 and 2. Although, the arcuate surface 29 of the flange 34 is conveniently drawn as a disk, other embodiments of the flange 34, would provide the self aligning and ease of insertion advantages of this invention. For example, in alternative embodiments, the flange 34 could have an arcuate surface of "a" degrees, less than then 360 degree circular perimeter of the flange, as shown in FIG. 2, with the remaining perimeter (360 degrees —"a") with a square or rectangular shape.

Figure 10:
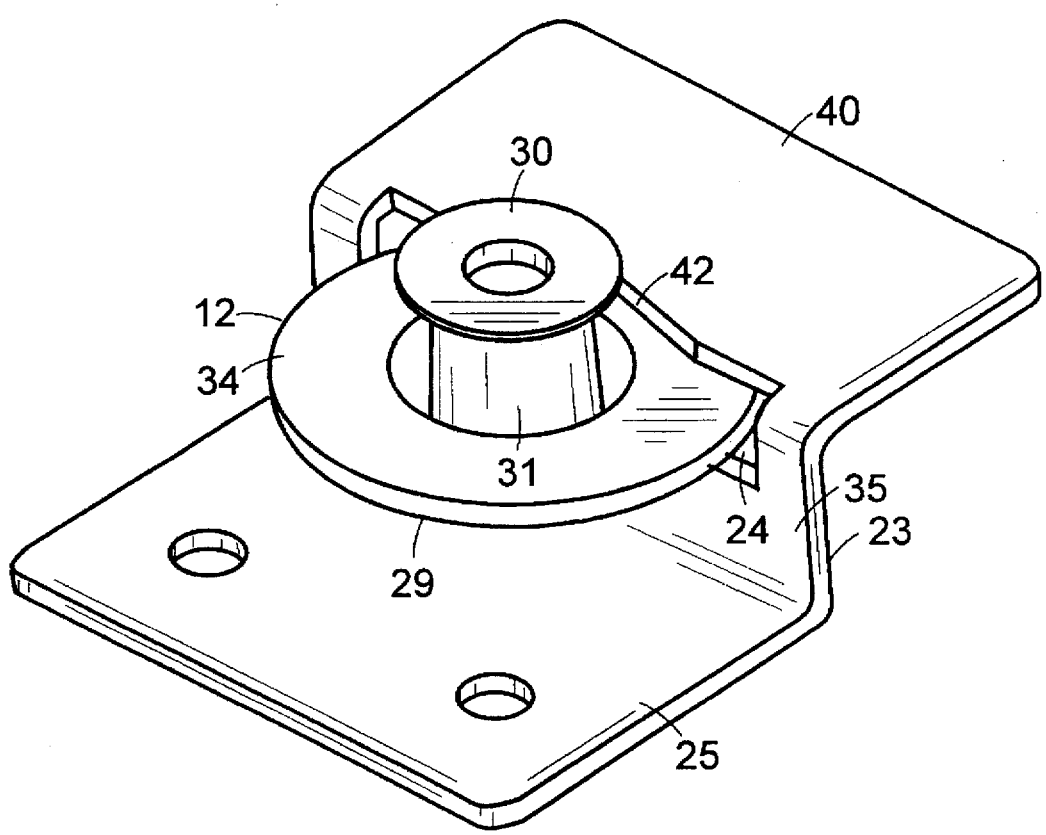
FIG. 10 is a perspective view of the securement member in a snug fit relationship within the slot of the mating member, embodying the principles of the invention.

The mounting surface 30 is mounted to the securement portion area 16 of the board 10, as shown in FIGS. 1 and 2. Because it is advantageous to devote a maximum area of the board's 10 top major surface for mounting electronic components, the diameter of the mounting surface 30 ranges from 3 to 4 millimeters. However, in alternative embodiments the mounting surface 30 and securement surface 16 could have smaller or larger surface areas and diameters. The area of the mounting surface 30 and securement surface 16 should be such that there is adequate support of the mating member 23 and in general, adequate support of the board mounting system to promote securement and minimal vibration of the board 10. The posting surface 31 extends at angle "b" from the flange 34 to provide a flange 34 with an arcuate surface 29 that promotes a snug fit relationship between the securement member 12 and the mating member 23, as shown in FIGS. 2 and FIG. 10. As shown in FIG. 4, the posting surface portion 31 extends from 1 to 8 millimeters at an angle of 10 to 20 degrees from the Securement "Y-axis" 32 drawn from the mounting surface 30 to the flange 34. Alternative embodiments of this invention may have a posting surface 31 with a length that provides a larger or smaller spaced relation between the board 10 and the flange 34 than described above.

Figure 6:
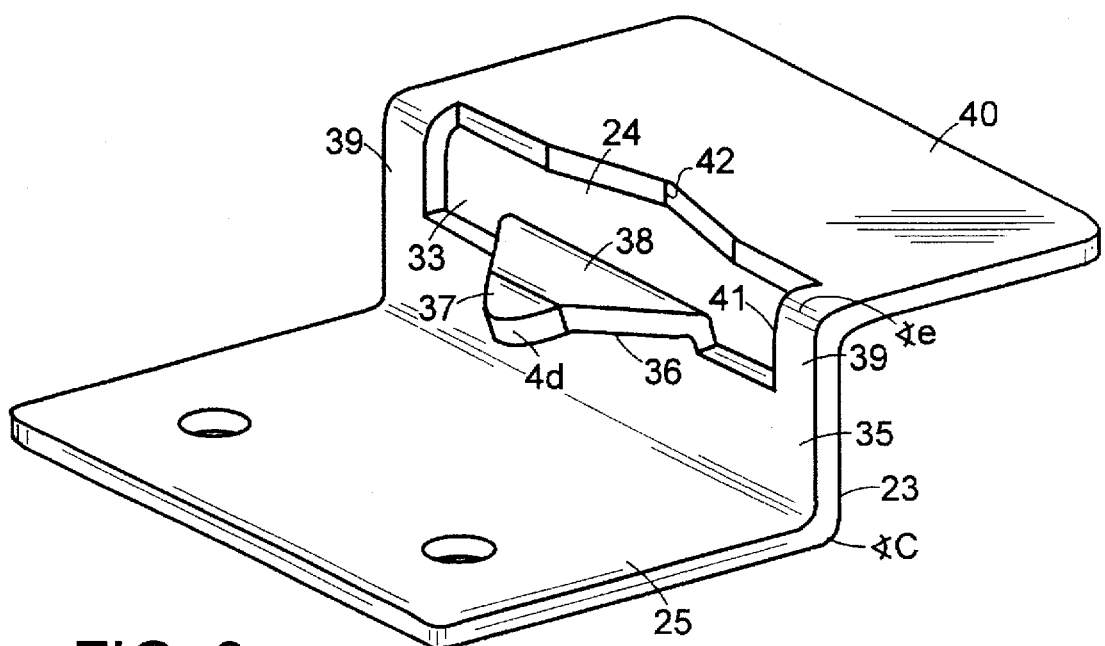
FIG. 6 is a perspective view of the mating member having a slot and a guiding surface as shown in FIGS. 1 and 2 that receives the securement member as shown in FIGS. 1, 2, 3, 4 and 5.
Figure 7:
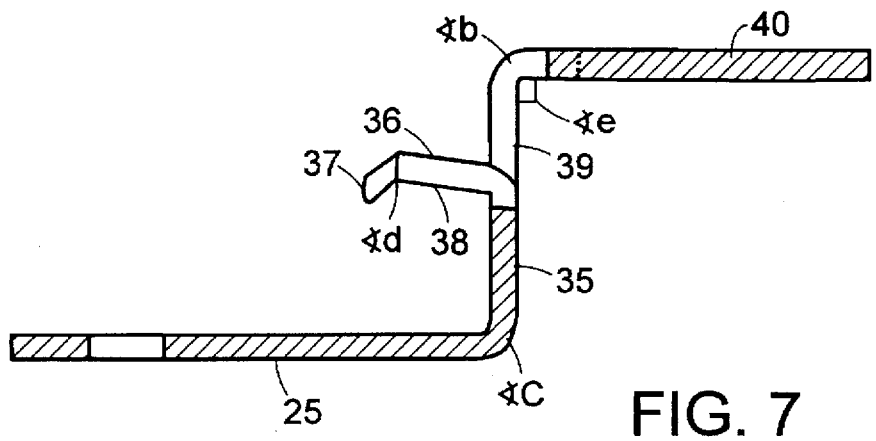
FIG. 7 is a side planar view of the mating member having a slot and a guiding surface as shown in FIGS. 1, 2 and 6.
Figure 8:
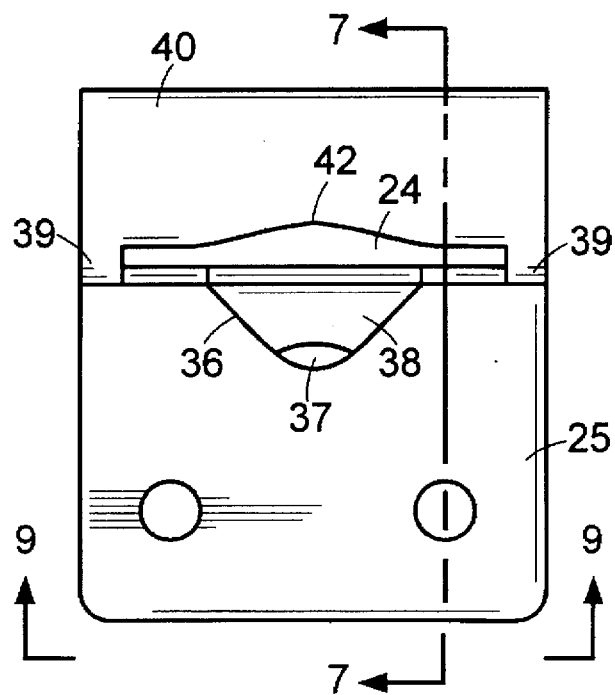
FIG. 8 is a elevated view of the mating member having a slot and guiding surface as shown in FIGS. 1, 2, 6 and 7.
Figure 9:
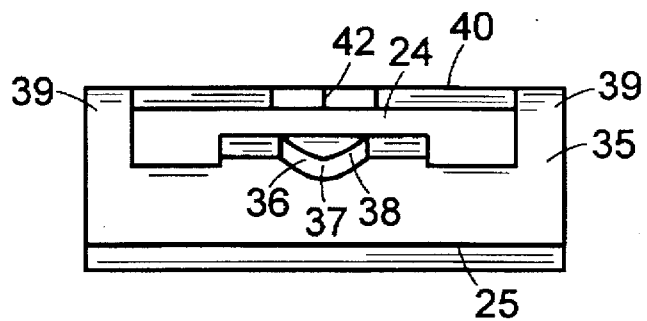
FIG. 9 is a from planar view of the mating member having a slot and guiding surfaces as shown in FIGS. 1, 2, 6, 7 and 8.

The flange 34 extends from the posting surface 30 and accordingly is in a spaced relation with the mating member 23. The diameter of the flange 34 is such that a snug-fit relation forms when the disk is inserted in the slot 24 of the mating member 23. The thickness "t" of the flange 34 is determined by a number of factors that include the rigidity of materials of the securement member 12 and the height 33, of the slot 24 of the mating member 23, as shown in FIGS. 6 and 10. FIGS. 6, 7, 8 and 9 show the mating member 23 made of rigid material having a mounting area 25, a transition area 35, a slot 24, a tongue 36 having a guiding surface 37 and an entry surface 38, two slot flaming posts 39 and an ending area 40. As shown in FIGS. 1 and 2, the mating member 23 is being positioned and mounted on the top surface of the base 10 to receive the securement member 12. The width of the mounting surface 25 may range from 20 to 35 millimeters, however, alternative embodiments of this invention may have a mounting area 25 with different widths. The width of the mounting area 35 should provide adequate support for inserting and securing the securement member 12 within the mating member 23.

A transition area 35 extends at an angle "c" from the mounting surface 25 and for a length such that the spaced relation between the slot 24 and the base 18, as shown in FIGS. 1 and 2, positions the slot 24 to receive the securement member 12. The transition surface 35 extends to a tongue 36 having two surfaces, a guiding surface 37 and an entry surface 38, a slot 24, and two slot framing posts 39. The guiding surface 37 is triangular shaped and projects upward from its outer point at angle "d", an angle promoting the self alignment and ease of the slot 24 receiving the securement member 12. The guiding surface 37 extends back from its tip to a horizontal entry surface 38 at angle "d" such that the guiding surface 37 vertically aligns the securement member 12 as the flange 34 enters the slot 24 of the mating member 23. Alternative embodiments of the invention may have a guiding surface 37 with a shape other than triangular to promote the vertical alignment of the securement member 12 as it enters the mating member 23. For example, a guiding surface 37 could have a curved or squared shape.

Generally, the rear edge of the entry surface 38, the top edge of the transition surface portion 35, two slot framing posts 39 and the front edge 42 of an ending area 40 define the perimeter of the mating member slot 23. The height 33 of the mating member slot 24 is directly proportional to the thickness "t" of the flange 34, as shown in FIGS. 1–5.

The slot framing posts 39 define the arch of the slot 24 at an angle "e", and extending to the ending area 40. The two sides comprising the front edge 42 of the ending area 40 outlining a triangular shape. The triangular cut into the end surface portion 40 promotes alignment and securement of the flange 34 of the securement member 12 to the slot 24 of the mating member 23.

Referring now to FIG. 10, the mating member 23 having a slot 24 as shown in FIGS. 1,2,6,7,8 and 9, has received a portion of the securement member 12, as shown in FIGS. 1,2,3,4 and 5, in a self-aligning process to form a snug fit relationship. As the securement member 12 approaches the mating member 23, the arcuate surface 29 of the flange 34 and the guiding surface 37, of the mating member 23, as shown in FIGS. 6–9, promote a self aligning process. The arcuate surface 29 of the flange 34 vertically aligns the securement member and promotes ease of insertion because there are no corners or impedances upon the securement member 12 that would prevent the insertion of the flange 34 of the securement member 12 into slot 24 of the mating member 23. Further, as the flange 34 of the securement member approaches the slot 24, the upward projecting angle "d" of the guiding edge surface 37, as shown in FIGS. 6–9, lifts and vertically aligns the flange 34 of the securement member 12 toward the entry surface 38, as shown in FIGS. 6–9, and into the slot 24 of the mating member 12. As the arcuate surface 29 of the flange 34 enters the slot 24, the posting area 31 of the securement member 12 directly contacts and abuts against the front edge 42 of the ending area 40 of the mating member 12.

The from edge 42 of the end surface portion 40 promotes a secure relationship of the securement member within the slot of the mating member 23. The two sides of the front edge 42 of the ending area 40 form a triangular indented cut for secure insertion of the flange 34 within the slot 24 of the mating member 23. Alternative embodiments could have a front edge 42 that forms different shaped indented cuts to secure the flange 34 within the slot 23 of the mating member 23. For example a front edge forming an arc, square, or rectangular, etc. shaped indented cut could be used to secure the flange 34 within the slot 24 of the mating member 23.

It is apparent that, within the scope of the invention, modifications and different arrangements may be made other than as herein disclosed. The present disclosure is merely illustrative, the invention comprehending all variations thereof.

What is claimed is:

1. A system for securing together two surface areas comprising:

a mating member having a slot, such member being attached to one of the surface areas;

securement member of rigid material having a surface portion with a shape for self-guiding interengagement with the slot, said securement member having an arcuate shape, such securement member being attached to the other of the surface areas, the surface areas being movable relative to each other such that when the mating member and the securement member are moved toward each other the surface portion of the securement member self-guiding interengages the slot of the mating member.

2. The system of claim 1, wherein the surface portion of the securement member has a disk shape.

3. The system of claim 1 further including a receptacle defining one of the surface areas and a board defining the other surface area, the mating member being attached to the structure and the securement member being attached to the board such that the interengaging movement of the structure and board provide interengagement of the securement member and the slot of the mating member forming a secure relationship between the board and the structure.

4. A system for securing together two surface areas comprising:

a receptacle comprising opposed spaced apart walls having inwardly facing surfaces and a base defining one of the surface areas and connecting the two opposed spaced apart walls;

a mating member having a slot, such member being attached to one of the surface areas;

a board defining the other one of the surface areas;

a securement member having a surface portion with a shape for self-guiding interengagement with the slot, such securement member being attached to the other one of the surface areas, the surface areas being movable relative to each other such that when the mating member and the securement member are moved toward each other the surface portion of the securement member self-guidingly interengages the slot of the mating member; and, a support attached to the inwardly facing surfaces of the opposed spaced apart walls, the supports being positioned so that the board is movable along a path causing the securement member to enter the slot of the mating member.

5. The system of claim 4, wherein the supports are guide members, each of the guide members having a slot facing inwardly and extending along the inwardly facing surfaces of the opposing walls, each of the slots having a back wall surface, the back wall surface of the slot being spaced apart a distance greater than the width of the board, the board being slideably mounted within the slot of the guide members into a mounted position such that the slot receives the securement member.

6. The system of claim 5, wherein the supports are grooves along the inwardly facing walls.

7. The system of claim 2, wherein the securement member further includes a flange having a surface portion with a shape for guiding interengagement with the slot.

8. The system of claim 7, wherein the securement member further includes a post holding the flange in spaced apart relation to the other one of the surface areas.

9. The mating member of claim 5 further includes a tongue extending laterally from the lower edge of the slot.

10. The mating member of claim 9, wherein the slot is longitudinal in shape with its longitudinal dimension extending in a direction parallel to one of the surface areas and the tongue extending from one of the longitudinal edges parallel to one of the surface areas.

11. The mating member of claim 10, wherein the tongue has an entry surface extending laterally from the bottom edge of the slot and a guiding surface extending from the entry surface in an angled direction relative to the one of the surface areas promoting guiding support and ease of insertion of the surface portion of the securement member into the slot of the mating member.

12. The system of claim 4, wherein the board is a CPU board having electronic components attached to the major surface areas of the board.

* * * * *